(12) United States Patent
Durlam et al.

(10) Patent No.: US 7,105,363 B2
(45) Date of Patent: Sep. 12, 2006

(54) CLADDED CONDUCTOR FOR USE IN A MAGNETOELECTRONICS DEVICE AND METHOD FOR FABRICATING THE SAME

(75) Inventors: Mark A. Durlam, Chandler, AZ (US); Jeffrey H. Baker, Chandler, AZ (US); Brian R. Butcher, Gilbert, AZ (US); Mark F. Deherrera, Tempe, AZ (US); John J. D'Urso, Chandler, AZ (US); Earl D. Fuchs, Phoenix, AZ (US); Gregory W. Grynkewich, Gilbert, AZ (US); Kelly W. Kyler, Mesa, AZ (US); Jaynal A. Molla, Gilbert, AZ (US); J. Jack Ren, Phoenix, AZ (US); Nicholas D. Rizzo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/082,617

(22) Filed: Mar. 16, 2005

(65) Prior Publication Data

US 2005/0158992 A1     Jul. 21, 2005

Related U.S. Application Data

(62) Division of application No. 10/306,250, filed on Nov. 27, 2002, now Pat. No. 6,885,074.

(51) Int. Cl.
*H01L 21/00* (2006.01)
(52) U.S. Cl. .................. 438/3; 438/652; 438/653; 438/666; 257/E21.002
(58) Field of Classification Search .................... 438/3, 438/652, 653, 666
See application file for complete search history.

(56) References Cited

U.S. PATENT DOCUMENTS

| 6,211,090 B1 * | 4/2001 | Durlam et al. ............. 438/692 |
| 2003/0170976 A1 * | 9/2003 | Molla et al. ............. 438/637 |

* cited by examiner

*Primary Examiner*—Zandra V. Smith
*Assistant Examiner*—Christy Novacek
(74) *Attorney, Agent, or Firm*—Ingrassia, Fisher&Lorenz (57) ABSTRACT

A method for fabricating a cladded conductor (42) for use in a magnetoelectronics device is provided. The method includes providing a substrate (10) and forming a conductive barrier layer (12) overlying the substrate (10). A dielectric layer (16) is formed overlying the conductive barrier layer (12) and a conducting line (20) is formed within a portion of the dielectric layer (16). The dielectric layer (16) is removed and a flux concentrator (30) is formed overlying the conducting line (20).

19 Claims, 6 Drawing Sheets

CLADDED CONDUCTOR FOR USE IN A MAGNETOELECTRONICS DEVICE AND METHOD FOR FABRICATING THE SAME

RELATED APPLICATIONS

This application is a divisional of application Ser. No. 10/306,250, filed Nov. 27, 2002 now U.S. Pat. No. 6,885,074.

FIELD OF THE INVENTION

The present invention relates generally to magnetoelectronics devices, and more particularly to a cladded conductor for use in a magnetoelectronics device and a method for fabricating the cladded conductor.

BACKGROUND OF THE INVENTION

Magnetoelectronics devices, spin electronics devices and spintronics devices are synonymous terms for devices that use the effects predominantly caused by electron spin. Magnetoelectronics effects are used in numerous information devices, and provide non-volatile, reliable, radiation resistant, and high-density data storage and retrieval. The numerous magnetoelectronics information devices include, but are not limited to, magnetic random access memory (MRAM), magnetic sensors and read/write heads for disk drives.

Generally, a magnetoelectronics information device is constructed with an array of magnetoelectronics elements (e.g., giant magnetoresistance (GMR) elements or magnetic tunnel junction (MTJ) elements) formed in a substrate that may also include a variety of semiconductor devices, such as, for example, MOSFETs. The magnetoelectronics elements are programmed by the magnetic field created from a current-carrying conductor. Typically, two current-carrying conductors, one formed underneath the magnetoelectronics element and one formed on top of the magnetoelectronics element, are arranged in cross point matrix to provide magnetic fields for programming of the magnetoelectronics element.

Advanced semiconductor processes often use copper metal interconnects for the current-carrying conductors. The preferred method of forming the top copper metal interconnect is by a damascene or inlaid process during which a trench is patterned and etched in a dielectric layer, followed by the deposition of a copper layer within the trench. Any excess copper is removed, typically by chemical mechanical planarization (CMP). After formation of the copper metal interconnect, the surrounding dielectric layer may be removed to allow for deposition of a cladding layer over the interconnect. Cladding layers are used to focus the magnetic flux of the interconnect to the magnetoelectronics element.

One method used to remove the dielectric layer is dry plasma etching. However, the copper metal interconnect and semiconductor devices in the substrate may accumulate charge from the plasma which may create an over voltage or over current condition that is damaging to the semiconductor devices. For example, if a semiconductor device is a MOSFET and the copper metal interconnect is electrically coupled to the gate, source or drain of the MOSFET, the plasma-induced charge may inject hot carriers into the gate oxide, thus causing a shift in device performance.

Accordingly, it is desirable to provide an improved method for fabricating a cladded conductor for use in a magnetoelectronics device. It is also desirable to provide a cladded conductor that does not adversely affect devices electrically coupled thereto. Other desirable features and characteristics of the present invention will become apparent from the subsequent description and the appended claims, taken in conjunction with the accompanying drawings.

BRIEF DESCRIPTION OF THE DRAWINGS

The following drawings are illustrative of particular embodiments and therefore do not limit the scope of the invention, but are presented to assist in providing a proper understanding. The drawings are not to scale (unless so stated) and are intended for use in conjunction with the explanations in the following detailed description. The present invention will hereinafter be described in conjunction with the appended drawings, wherein like reference numerals denote like elements, and.

DETAILED DESCRIPTION OF THE DRAWINGS

The following detailed description is of exemplary embodiments only and is not intended to limit the invention or the application and uses of the invention. Rather, the following description provides a convenient illustration for implementing exemplary embodiments of the invention. Various changes to the described embodiments may be made in the function and arrangement of the elements described without departing from the scope of the invention as set forth in the appended claims. Furthermore, there is no intention to be bound by any theory presented in the preceding background of any exemplary embodiments of the invention.

Figure 1:
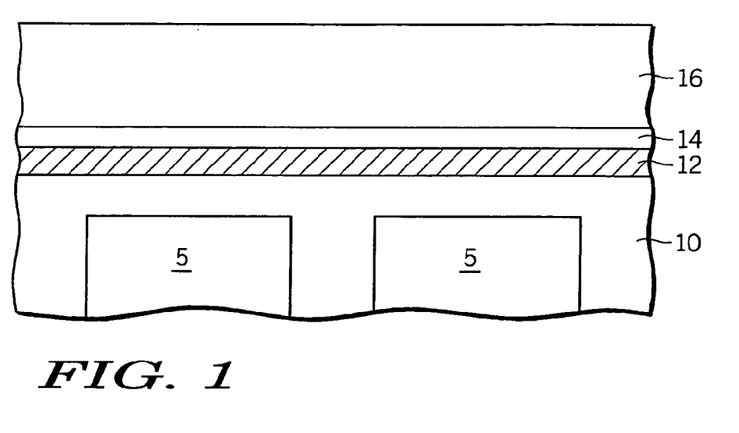
FIGS. 1–9 illustrate schematically, in cross section, a method for fabricating a cladded conductor in accordance with an exemplary embodiment of the invention.

Turning now to the figures, FIGS. 1–9 illustrate a method for fabricating a cladded conductor for use in a magnetoelectronics device in accordance with an exemplary embodiment of the present invention. The magnetoelectronics device may include a random access memory, magnetic sensors, inductors, read/write heads for disk drives, and any other device that utilizes the magnetic properties of a current-carrying conductor. Referring to FIG. 1, the method may begin by providing a substrate 10, such as, for example, a semiconductor substrate. Substrate 10 can include circuitry, such as sense amplifiers, transistors, magnetoelectronic elements, such as magnetoelectronic elements 5, which may comprise giant magnetoresistance (GMR) elements or magnetic tunnel junction (MTJ) elements, and digital circuitry, which circuitry has not been shown for simplicity.

A conductive barrier layer 12 is formed overlying substrate 10. Conductive barrier layer 12 may comprise tantalum (Ta), tantalum nitride (TaN), titanium (Ti), titanium nitride (TiN), tantalum silicon nitride (TaSiN) or any other material that exhibits conductive properties suitable for distributing charge during plasma etching, as described below. Conductive barrier layer 12 has a thickness preferably in the range of about 100 to 2000 angstroms.

In one exemplary embodiment of the present invention, an etch stop layer 14 may be formed overlying conductive barrier layer 12. Etch stop layer 14 may be formed of any suitable etch stop material known and used in the semiconductor industry, such as material that is selective to fluorine (F)-based chemistries, or etch stop layer 14 may be formed of a material that provides an endpoint signal for stopping the etch process. Examples of suitable etch stop materials to provide the desired etch selectivity include aluminum oxide (AlO$_2$) and aluminum nitride (AlN) with a thickness in a range of 100 angstroms to 500 angstroms, or a silicon nitride (SiN) or silicon oxy-nitride (SiON) layer can be used to provide an endpoint signal.

A dielectric layer 16 then may be deposited overlying etch stop layer 14. Dielectric layer 16 typically is formed from any suitable type of insulative material, such as silicon oxide (SiO$_2$), tetraethyl orthosilicate (TEOS), silicon nitride (SiN) or other low-K dielectric material.

Figure 2:
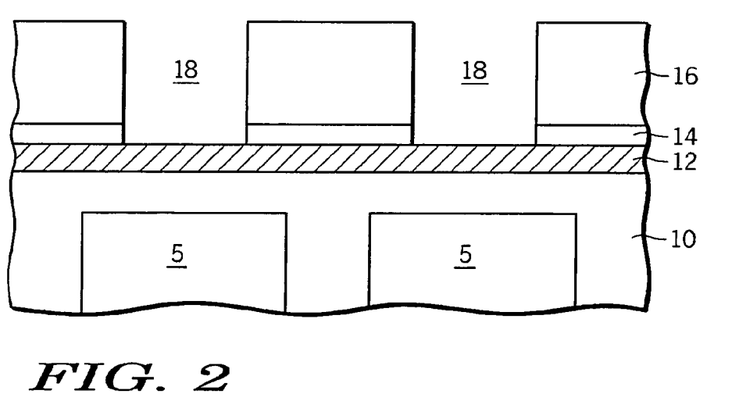

Referring to FIG. 2, a portion of dielectric layer 16 substantially overlying magnetoelectronic elements 5 may be removed by patterning and etching to form one, or more than one, trench 18 within dielectric layer 16. It will be appreciated that trench 18 may be of any length and height suitable to form an operative cladded conductor, as described in more detail below. Dielectric layer 16 may be etched utilizing standard etching techniques such as, for example, dry etch in plasma. Dielectric layer 16 is etched until etching is stopped by etch stop layer 14, which as previously described is formed as either a layer of material which is not amenable to the etching process used to etch dielectric layer 16, or which indicates a change of material that stops the etching due to an endpoint detection signal. Etch stop layer 14 then may be etched using any suitable etching technique for removing etch stop layer 14 to approximately conductive barrier layer 12 to complete formation of trench 18.

Figure 3:
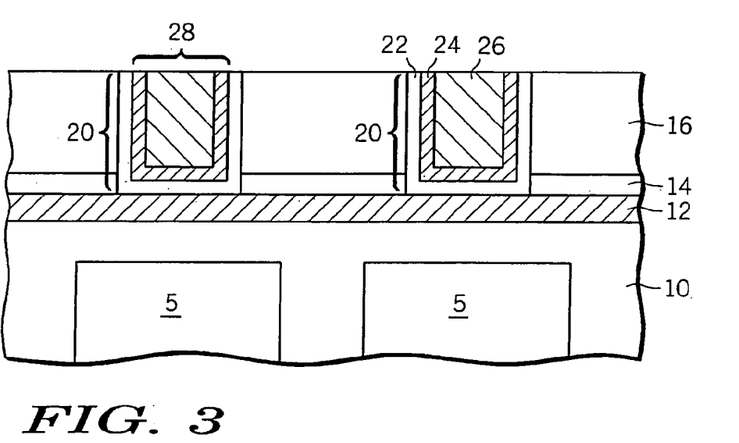

Turning to FIG. 3, a conducting line 20 is formed within trench 18. In one exemplary embodiment of the invention, conducting line 20 may be formed of copper (Cu), aluminum (Al), gold (Au), silver (Ag) and the like, or a combined alloy thereof. Preferably, conducting line 20 is formed of copper. In a more preferred embodiment of the invention, conducting line 20 may be formed of several layers, for example, a barrier layer 22, a seed layer 24, and a conductive core 26. Initially, barrier layer 22 may be deposited within trench 18. Barrier layer 22 may be formed of Ta, TaN, TaSiN, cobalt (Co), ruthenium (Ru), rhodium (Rh), palladium (Pd), or any other suitable nobel metal that does not readily form a native oxide and that hinders or prevents the ability of conductive core 26 from diffusing into or otherwise adversely reacting with surrounding materials. Barrier layer 22 may be deposited using physical vapor deposition (PVD), ionized metal plasma (IMP), chemical vapor deposition (CVD) or any other suitable technique known in the semiconductor industry. Seed layer 24 is next deposited in trench 18 using PVD, IMP, CVD or any other suitable technique known in the semiconductor industry. Next, conductive core 26 is formed within trench 18 by electroplating deposition. Together, seed layer 24 and core line 26 form a conducting system 28. Seed layer 24 and conductive core 26 may be comprised of copper, aluminum, gold, silver, and the like, or an combined alloy thereof. Preferably, seed layer 24 and conductive core 26 are formed of copper. After deposition of conductive core 26, any excess metal may be removed in the regions above trench 18, such as by chemical mechanical planarization (CMP) or the like.

Figure 4:
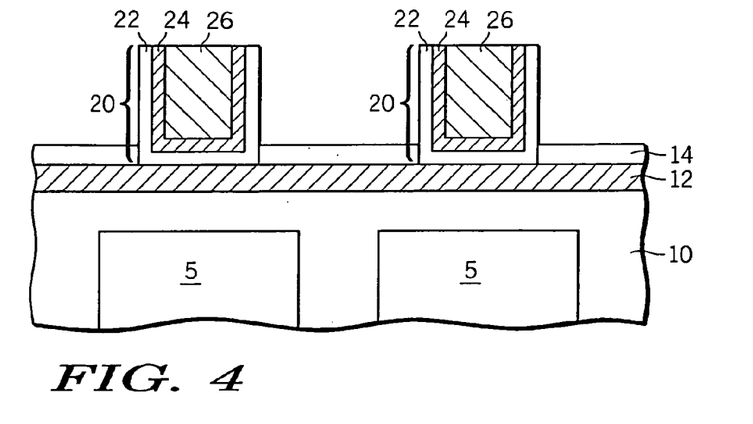

Referring to FIG. 4, dielectric layer 16 is removed down to etch stop layer 14. Dielectric layer 16 may be removed by a dry plasma etch process, such as that using fluorine-based chemistries, a wet chemistry etch process, or a combination thereof. If the removal of dielectric layer 16 is by dry plasma etch, any plasma-induced charging may be inhibited and/or dispersed by conductive barrier layer 12, thus reducing or eliminating any damage to semiconductor devices formed in substrate 10.

Figure 5:
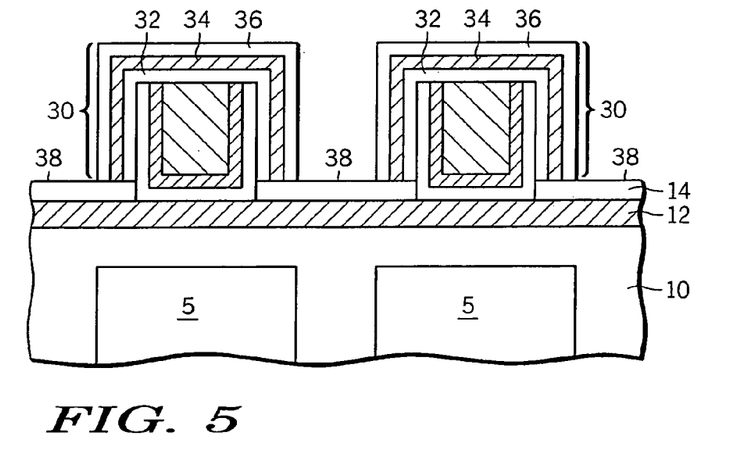

Next, as illustrated in FIG. 5, a flux concentrator 30 may be formed overlying the sides and top surface of conducting line 20 using a selective deposition process such as electroplating or electroless plating. If an electroplating deposition process is used, conductive barrier layer 12 serves as an electrode to carry current for the plating process. Etch stop layer 14 serves to hinder, or prevent altogether, electroplating from occurring between adjacent exposed conducting lines 20, thus preventing an electrical short therebetween. Accordingly, the deposition process results in a flux concentrator 30 that is self-aligned to conducting line 20.

Flux concentrator 30 comprises a flux concentrating layer 34. Flux concentrating layer 34 has the characteristic of concentrating magnetic flux produced by the current flowing in conducting line 20. Flux concentrating layer 34 is an electrically conducting magnetic material having high permeability, such as nickel iron (NiFe) having a ratio of approximately 80% nickel to 20% iron, or any suitable material having sufficiently high permeability to concentrate the magnetic flux in the desired area and be metallurgically compatible with the remaining material structure.

In another exemplary embodiment of the invention, flux concentrator 30 may also comprise a first barrier layer formed overlying conducting line 20 and underlying flux concentrating layer 34. First barrier layer 32 may be formed of a refractory metal material, such as cobalt (Co), cobalt iron (CoFe), ruthenium (Ru), rhodium (Rh), palladium (Pd), or other suitable material.

In a further exemplary embodiment of the invention, flux concentrator 30 may also comprise a second barrier layer 36 deposited overlying flux concentrating layer 34. Second barrier layer 36 may comprise at least one of Ru, Rh, Pd, and Co, including suitable materials comprising Ru, Rh, Pd and Co, such as, for example, cobalt phosphorous boron (CoPB), cobalt tungsten (CoT), cobalt boron (CoB), cobalt phosphorous (CoP) and the like.

Figure 9:
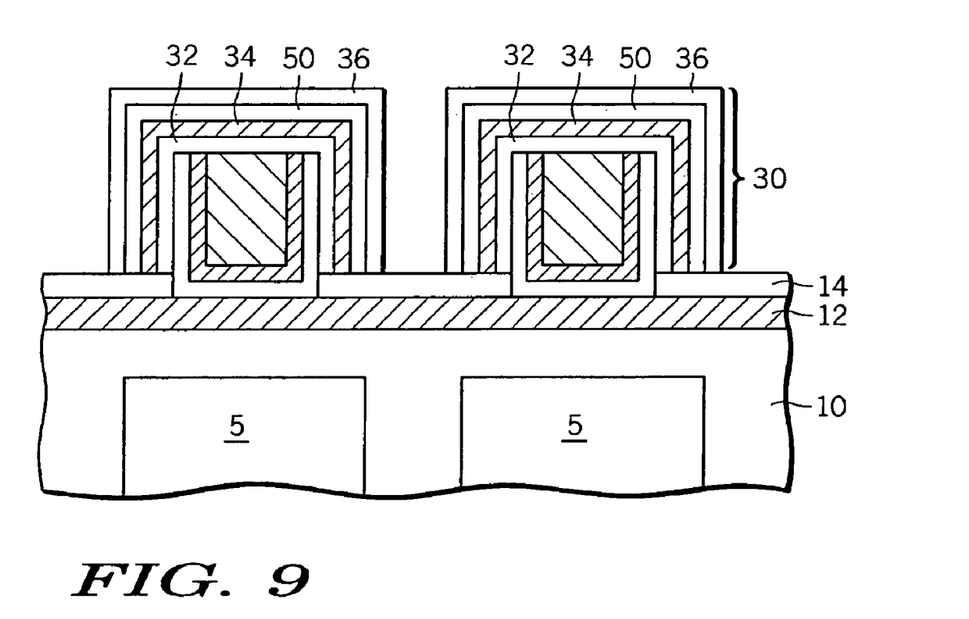

In another exemplary embodiment, referring momentarily to FIG. 9, a second flux concentrating layer 50 may be deposited over flux concentrating layer 34. Second flux concentrating layer 50 may be formed of any of the materials that may form flux concentrating layer 34 but may be selected to have magnetic and material properties different from flux concentrating layer 34 and, thus, may provide greater flexibility to control the properties of flux concentrator 30. For example, second flux concentrating layer 50 may have a different permeability, a different coercivity, a different thickness or any number of other magnetic or material properties different from flux concentrating layer 34.

Figure 6:
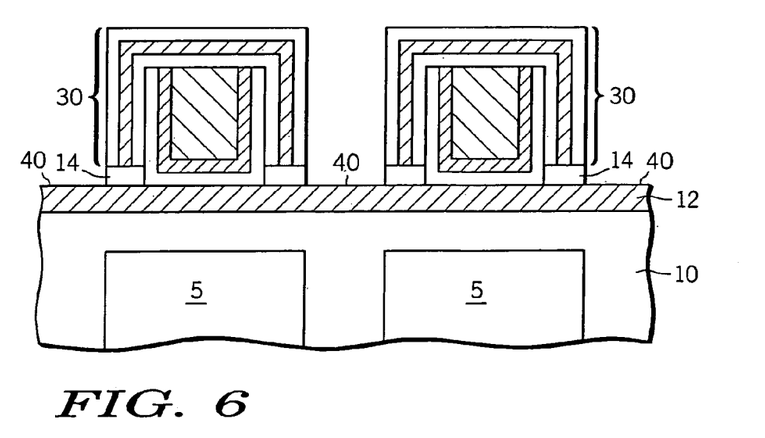

Turning back to FIG. 5, upon formation of flux concentrator 30, portions 38 of etch stop layer 14 are exposed. Referring now to FIG. 6, exposed portions 38 of etch stop layer 16 may be removed by a process, such as, for example, wet chemistry etching, that is selective to the material of flux concentrator 30 and to conductive barrier layer 12. Upon removal of exposed portions 38 of etch stop layer 16, portions 40 of conductive barrier layer 12 are exposed.

Figure 7:
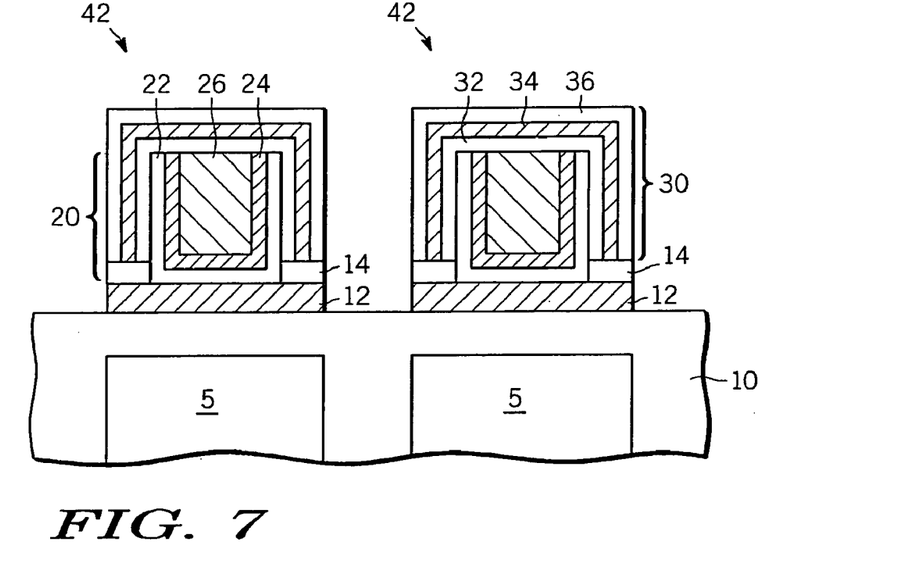

Referring to FIG. 7, exposed portions 40 of conductive barrier layer 12 may be removed. Exposed portions 40 may be removed by short dry plasma etch, physical sputtering, wet etching or any other suitable process. Thus, as illustrated in FIG. 7, a cladded conductor 42 is formed. The cladded conductor 42 comprises a conductive barrier layer 12, a conducting line 20 formed overlying conductive barrier layer 12, and a flux concentrator 30 formed overlying conducting line 20.

Figure 8:
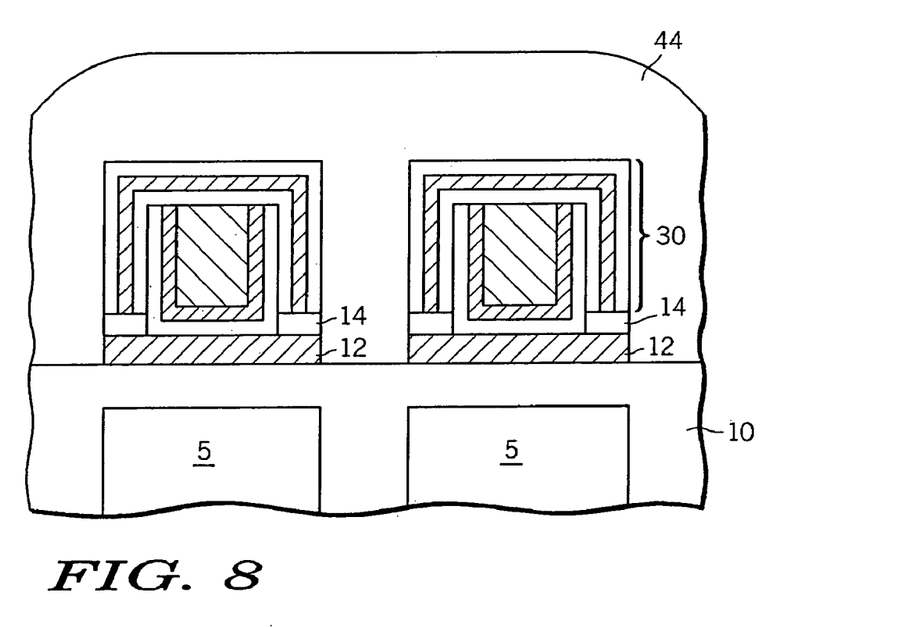

Referring to FIG. 8, a passivation layer 44 may be deposited overlying flux conductor 30. Any conventional passivation material may be used to form passivation layer 44.

Figure 10:
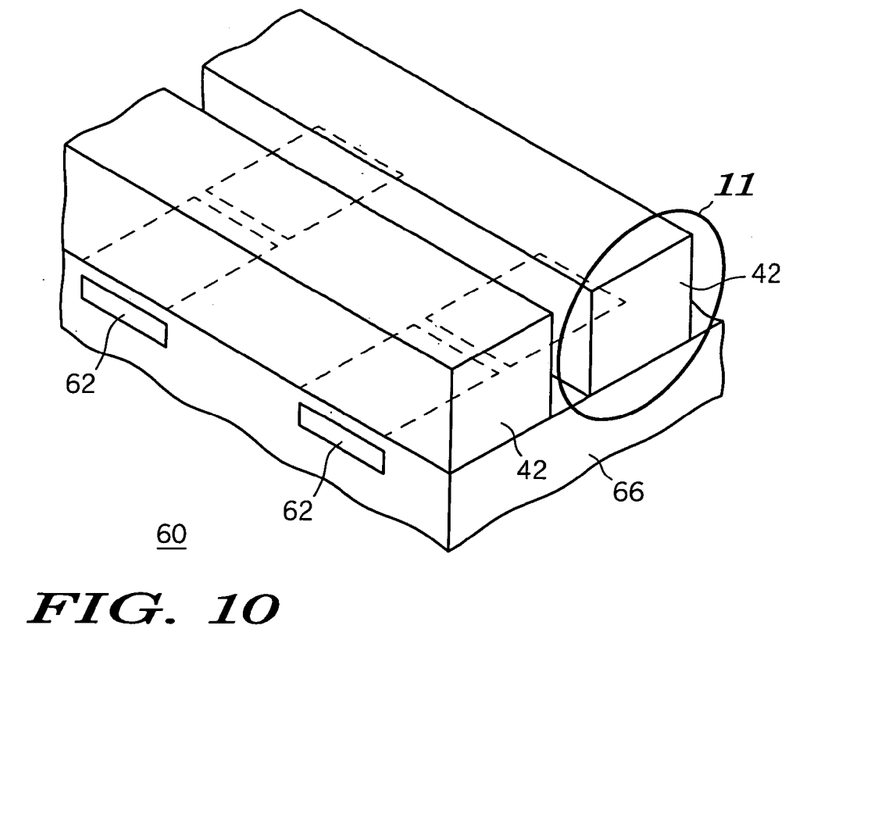
FIG. 10 is an enlarged perspective view of a portion of a random access memory device in accordance with an exemplary embodiment of the present invention.

FIG. 10 illustrates an enlarged perspective view of a portion of a random access memory device 60 in accordance with another exemplary embodiment of the present invention. Random access memory device 60 includes a plurality of magnetic memory units 62, each of which is magnetically coupled to a cladded conductor 42, such that a magnetic field created by cladded conductor 42 may be used to program the plurality of magnetic memory units 62. Magnetic memory units 62 may be giant magnetoresistance (GMR) elements or magnetic tunnel junction (MTJ) elements. Magnetic memory units 62 may be formed on any suitable substrate 66, such as a semiconductor substrate, which may include any suitable semiconductor devices (not shown), such as for example, transistors, bit and/or data lines, input/output circuits, data/address decoders, and the like.

Figure 11:
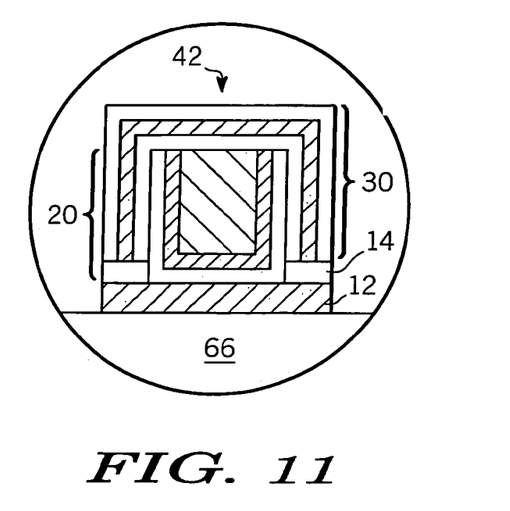
FIG. 11 is a magnified view of a portion of a conductor of the random access memory device of FIG. 10.

FIG. 11 illustrates a magnified view of cladded conductor 42. Elements of FIG. 11 that have the same reference numbers as FIG. 7 are the same as the corresponding FIG. 7 elements. Cladded conductor 42 includes conductive barrier layer 12, conducting line 20 overlying conductive barrier layer 12, and flux concentrator 30 overlying conducting line 20.

Figure 12:
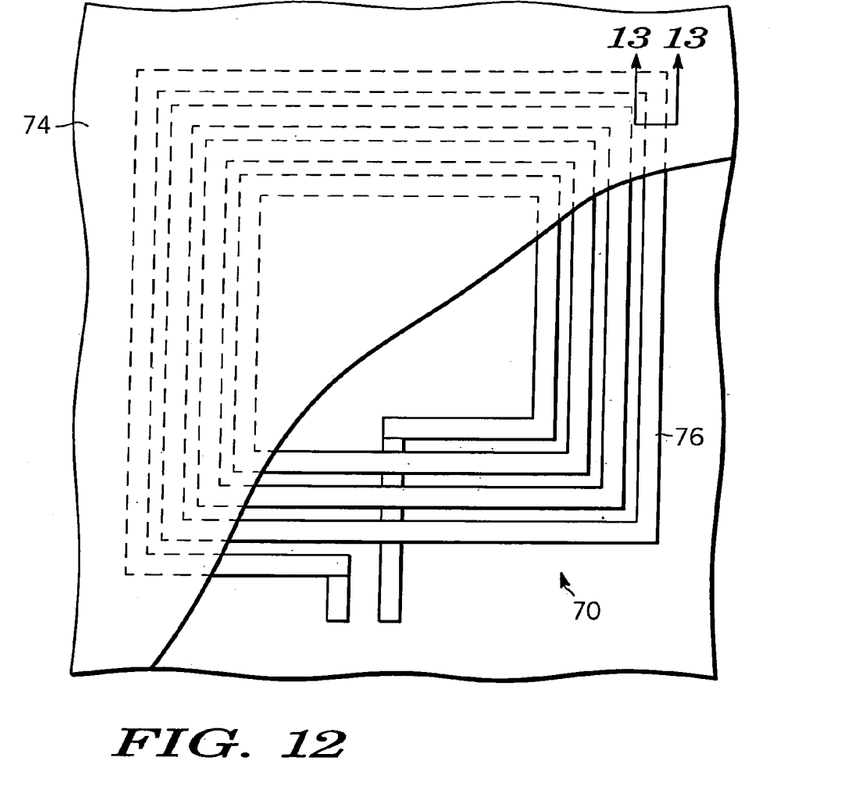
FIG. 12 is a top view of a spiral inductor in accordance with an exemplary embodiment of the present invention.
Figure 13:
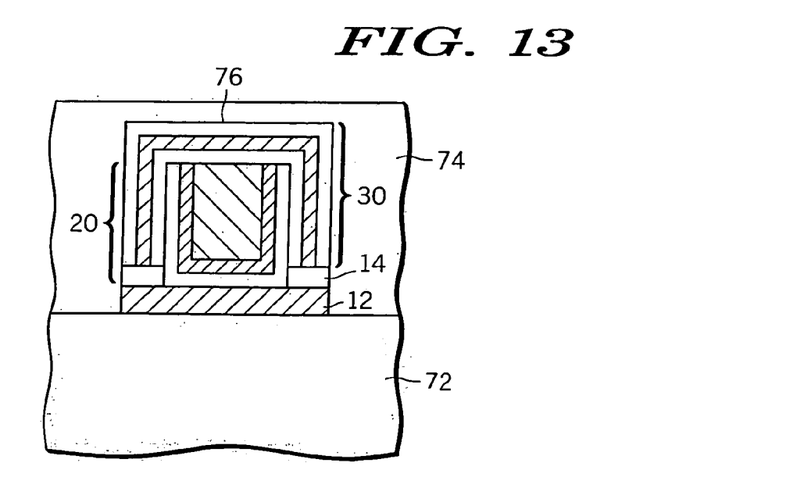
FIG. 13 is a cross-sectional view of the coil of the spiral inductor of FIG. 12.

It will be appreciated that the present invention is not limited to use in magnetoelectronic information devices such as random access memories, but can also be used for other magnetoelectronic devices, such as, for example, inductors and other devices that take advantage of the magnetic properties of current-carrying conductors. FIGS. 12 and 13 show top and cross-sectional views of a spiral inductor 70 formed in accordance with an exemplary embodiment of the present invention. Spiral inductor 70 is fabricated over a substrate 72, which may be a semiconductor substrate formed of silicon (Si), germanium (Ge), or silicon-on-insulator (SOI), for example. A dielectric material layer 74 is formed overlying substrate 72. Dielectric material layer 74 may be formed from silicon dioxide, tetraethyl orthosilicate (TEOS) or any other suitable dielectric material. Dielectric material layer 74 overlies a spiral coil 76. Elements of FIG. 13 that have the same reference numbers as FIG. 7 are the same as the corresponding FIG. 7 elements. Spiral coil 76 includes conductive barrier layer 12, conducting line 20 overlying conductive barrier layer 12 and flux concentrator 30 overlying conducting line 20. Conductive barrier layer 12, conducting line 20 and flux concentrator 30 may be formed using the process described above with reference to FIGS. 1–9.

From the foregoing description, it should be appreciated that a method for fabricating a cladded concentrator for use in a magnetoelectronics device is provided that presents benefits that have been presented in the foregoing background and description and also presents benefits that would be apparent to one skilled in the art. Furthermore, while a preferred exemplary embodiment has been presented in the foregoing description, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

What is claimed is:

1. A method for making a semiconductor device, the method comprising:
   providing a substrate;
   forming a conductive barrier layer overlying said substrate;
   forming a dielectric layer overlying said conductive barrier layer;
   forming a conducting line within a portion of said dielectric layer;
   removing said dielectric layer;
   forming a flux concentrator overlying said conducting line;
   forming said flux concentrator overlying first portions of said conductive barrier layer and exposing second portions of said conductive barrier layer; and
   removing said second portions of said conductive barrier layer.

2. The method of claim 1, further comprising forming an etch stop layer overlying said conductive barrier layer and underlying said dielectric layer, wherein forming said conducting line includes forming a conducting line within a portion of said etch stop layer.

3. The method of claim 1, wherein forming said conductive barrier layer comprises forming said conductive barrier layer of at least one of tantalum, tantalum nitride, titanium, titanium nitride, and tantalum silicon nitride.

4. The method of claim 1, wherein forming said conducting line comprises patterning and etching a trench in said dielectric layer and forming said conducting line within said trench.

5. The method of claim 1, wherein forming said conducting line comprises forming a conducting line of at least one of copper, aluminum, gold, and silver.

6. The method of claim 1, wherein forming said flux concentrator comprises forming a flux concentrating layer of nickel iron (NiFe).

7. The method of claim 1, wherein forming said flux concentrator comprises forming a first flux concentrating layer overlying said conducting line and forming a second flux concentrating layer overlying said first flux concentrating layer, wherein said first and second flux concentrating layers are formed having at least one of different magnetic properties and different material properties.

8. A method for fabricating a cladded conductor for use in a magnetoelectronics device, the method comprising:
   forming a conductive barrier layer overlying a substrate comprising a magnetoelectronic element;
   depositing a dielectric layer overlying said conductive barrier layer;
   etching said dielectric layer to firm a trench overlying said magnetoelectronic element;
   forming a conducting line within said trench such that said conducting line is magnetically coupled to said magnetoelectronic element;

removing said dielectric layer;

forming a flux concentrator on a portion of said conducting line;

forming said flux concentrator overlying first portions of said conductive barrier layer and exposing second portions of said conductive barrier layer; and removing said second portions of said conductive barrier layer.

9. The method of claim 8, wherein forming said conductive barrier layer comprises forming said conductive barrier layer from a material selected from the group consisting of tantalum, tantalum nitride, titanium, titanium nitride, and tantalum silicon nitride.

10. The method of claim 8, further comprising depositing an etch stop layer overlying said conductive barrier layer before depositing said dielectric layer.

11. The method of claim 10, wherein etching said dielectric layer to form a trench further comprises etching said etch stop layer to form said trench.

12. The method of claim 11, wherein forming said conducting line within said trench comprises forming said conducting line such that said conducting line is electrically coupled to said conductive barrier layer.

13. The method of claim 11, wherein removing said dielectric layer comprises removing said dielectric layer using a dry plasma etch process.

14. A method for fabricating a random access memory device, the method comprising:

forming a conductive barrier layer overlying a substrate comprising a plurality of magnetoelectronic elements;

depositing a dielectric layer overlying said conductive barrier layer;

etching said dielectric layer to form a plurality of trenches, each of said plurality of trenches overlying one of said plurality of magnetoelectronic elements;

forming a conducting line within each of said plurality of trenches, wherein said conducting line within each of said plurality of trenches is magnetically coupled to one of said plurality of magnetoelectronic elements and is electrically coupled to said conductive barrier layer;

removing said dielectric layer;

forming a flux concentrator on a portion of said conducting line; and removing a portion of said conductive barrier layer after forming said flux concentrator.

15. The method of claim 14, further comprising depositing an etch stop layer overlying said conductive barrier layer and before depositing said dielectric layer.

16. The method of claim 15, wherein etching said dielectric layer to form a trench further comprises etching said etch stop layer to form said trench.

17. The method of claim 15, further comprising removing a portion of said etch stop layer after forming said flux concentrator.

18. The method of claim 14, wherein removing said dielectric layer comprises removing said dielectric layer using a dry plasma etch process.

19. A method for fabricating a random access memory device, the method comprising:

forming a conductive barrier layer overlying a substrate comprising a plurality of magnetoelectronic elements;

depositing a dielectric layer overlying said conductive barrier layer;

etching said dielectric layer to form a plurality of trenches, each of said plurality of trenches overlying one of said plurality of magnetoelectronic elements;

forming a conducting line within each of said plurality of trenches, wherein said conducting line within each of said plurality of trenches is magnetically coupled to one of said plurality of magnetoelectronic elements and is electrically coupled to said conductive barrier layer;

removing said dielectric layer;

forming a flux concentrator on a portion of said conducting line; and removing a portion of said etch stop layer after forming said flux concentrator.

* * * * *